(12) United States Patent
Jeong et al.

(10) Patent No.: US 10,915,020 B2
(45) Date of Patent: Feb. 9, 2021

(54) PHOTOSENSITIVE RESIN COMPOSITION, PHOTOSENSITIVE RESIN LAYER USING SAME AND COLOR FILTER

(71) Applicant: Samsung SDI Co., Ltd., Yongin-si (KR)

(72) Inventors: Jiyoung Jeong, Suwon-si (KR); Bumjin Lee, Suwon-si (KR); Yonghee Kang, Suwon-si (KR); Misun Kim, Suwon-si (KR); Jonggi Kim, Suwon-si (KR); Onyou Park, Suwon-si (KR); Hojeong Paek, Suwon-si (KR); Byeonggeun Son, Suwon-si (KR); Youn Je Ryu, Suwon-si (KR); Jinsuop Youn, Suwon-si (KR); Jihyeon Yim, Suwon-si (KR); Young Woong Jang, Suwon-si (KR); Minkyeol Chung, Suwon-si (KR); Hyunjoo Han, Suwon-si (KR); Kyunghee Hyung, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 137 days.

(21) Appl. No.: 16/334,207

(22) PCT Filed: Nov. 28, 2017

(86) PCT No.: PCT/KR2017/013714
§ 371 (c)(1),
(2) Date: Mar. 18, 2019

(87) PCT Pub. No.: WO2018/110864
PCT Pub. Date: Jun. 21, 2018

(65) Prior Publication Data
US 2019/0278177 A1    Sep. 12, 2019

(30) Foreign Application Priority Data
Dec. 12, 2016   (KR) .................. 10-2016-0168748

(51) Int. Cl.
| | | |
|---|---|---|
| *G03F 7/032* | (2006.01) | |
| *G02B 5/20* | (2006.01) | |
| *C08G 63/688* | (2006.01) | |
| *G02B 1/04* | (2006.01) | |
| *G03F 7/00* | (2006.01) | |
| *G03F 7/031* | (2006.01) | |
| *G03F 7/033* | (2006.01) | |
| *G03F 7/038* | (2006.01) | |
| *G03F 7/039* | (2006.01) | |
| *G03F 7/105* | (2006.01) | |
| *G03F 7/004* | (2006.01) | |
| *G02B 5/22* | (2006.01) | |

(52) U.S. Cl.
CPC ......... *G03F 7/032* (2013.01); *C08G 63/6886* (2013.01); *G02B 1/04* (2013.01); *G02B 5/206* (2013.01); *G02B 5/22* (2013.01); *G03F 7/0007* (2013.01); *G03F 7/0047* (2013.01); *G03F 7/031* (2013.01); *G03F 7/033* (2013.01); *G03F 7/038* (2013.01); *G03F 7/039* (2013.01); *G03F 7/105* (2013.01)

(58) Field of Classification Search
CPC ........ G03F 7/0007; G03F 7/027; G03F 7/028; G03F 7/031; G03F 7/032; G03F 7/033; G03F 7/038; G03F 7/105; G02B 5/20; G02B 5/201; G02B 5/206; G02F 1/133514; G02F 1/133516; C09G 63/6886
USPC .................................................. 430/7, 281.1
See application file for complete search history.

(56) References Cited

U.S. PATENT DOCUMENTS

| | | | |
|---|---|---|---|
| 2016/0011506 A1 | 1/2016 | Gu et al. | |
| 2017/0052444 A1* | 2/2017 | Park | C08F 220/14 |
| 2019/0243242 A1* | 8/2019 | Paek | G03F 7/0042 |
| 2019/0278173 A1* | 9/2019 | Kim | C08G 63/676 |

(Continued)

FOREIGN PATENT DOCUMENTS

| | | |
|---|---|---|
| CN | 103728837 A | 4/2014 |
| CN | 105504120 A | 4/2016 |
| CN | 106188398 A | 12/2016 |

(Continued)

OTHER PUBLICATIONS

Dimov, A. et al.; "Preparation Conditions Affecting the Permeability of Polyethylene Microfiltration Membranes"; Journal of Membrane Science; 52; 1990; pp. 109-113.

*Primary Examiner* — John A McPherson
(74) *Attorney, Agent, or Firm* — Lewis Roca Rothgerber Christie LLP

(57) ABSTRACT

A photosensitive resin composition including (A) a quantum dot; (B) a binder resin including a structural unit represented by Chemical Formula 1; (C) a photopolymerizable monomer; (D) a photopolymerization initiator; and (E) a solvent, photosensitive resin layer manufactured using the same, and a color filter including the photosensitive resin layer.

[Chemical Formula 1]

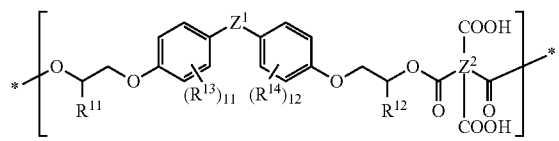

(In Chemical Formula 1, each substituent is the same as defined in the specification.)

14 Claims, No Drawings

(56) References Cited

U.S. PATENT DOCUMENTS

2020/0079649 A1* 3/2020 Miyanaga ................ G02B 5/20

FOREIGN PATENT DOCUMENTS

| | | |
|---|---|---|
| EP | 1 057 808 A2 | 12/2000 |
| JP | 2006-3860 A | 1/2006 |
| JP | 2006-259716 A | 9/2006 |
| JP | 2014-224240 A | 12/2014 |
| JP | 2015-155538 A | 8/2015 |
| JP | 2015-214688 A | 12/2015 |
| JP | 2016-23308 A | 2/2016 |
| JP | 5905939 B2 | 4/2016 |
| JP | 2016-139043 A | 8/2016 |
| KR | 10-2008-0077972 A | 8/2008 |
| KR | 10-2011-0114720 A | 10/2011 |
| KR | 10-2012-0087092 A | 8/2012 |
| KR | 10-2012-0089796 A | 8/2012 |
| KR | 10-2012-0089914 A | 8/2012 |
| KR | 10-2014-0112162 A | 9/2014 |
| KR | 10-1442969 B1 | 9/2014 |
| KR | 10-2015-0037393 A | 4/2015 |
| KR | 10-2015-0070979 A | 6/2015 |
| KR | 10-2015-0075039 A | 7/2015 |
| KR | 10-2015-0111853 A | 10/2015 |
| KR | 10-2016-0028276 A | 3/2016 |
| KR | 10-2016-0035515 A | 3/2016 |
| KR | 10-2016-0060904 A | 5/2016 |
| KR | 10-2016-0066221 A | 6/2016 |
| KR | 10-2016-0086739 A | 7/2016 |
| KR | 10-2016-0091708 A | 8/2016 |
| KR | 10-2016-0114292 A | 10/2016 |
| KR | 10-1895356 B1 | 9/2018 |
| WO | WO 2017/092650 A1 * | 8/2017 |

* cited by examiner

PHOTOSENSITIVE RESIN COMPOSITION, PHOTOSENSITIVE RESIN LAYER USING SAME AND COLOR FILTER

CROSS-REFERENCE TO RELATED APPLICATION(S)

This application is a National Phase Patent Application of International Patent Application Number PCT/KR2017/013714, filed on Nov. 28, 2017, which claims priority of Korean Patent Application No. 10-2016-0168748, filed Dec. 12, 2016. The entire contents of both of which are incorporated herein by reference.

BACKGROUND OF THE INVENTION

(a) Field of the Invention

This disclosure relates to a photosensitive resin composition, a photosensitive resin layer manufactured using the same, and a color filter including the photosensitive resin layer.

(b) Description of the Related Art

In general, a color filter applied to a display is formed by using a photosensitive resist composition, forming a desired pattern through an exposure process by using a photomask, and then, dissolving and removing a non-exposed region through a development process. A material for the color filter may be required of alkali-solubility, high sensitivity, adherence to a substrate, chemical resistance, heat resistance, and the like. However, the material for the color filter in general is not sufficiently cured through the exposure and thus needs to be thermally cured through a heat treatment at a high temperature of greater than or equal to 200° C. in order to obtain the required characteristics. Accordingly, the material for the color filter has a limit in being applied to electronic paper, OLED, and the like requiring a low temperature process.

On the other hand, an attempt to complement the insufficient curing characteristics by adding a compound, for example, epoxide, peroxide, and the like thereto to develop a photosensitive resin composition for a color filter requiring a relatively low temperature process for the electronic paper, the OLED, and the like has been made but does not secure sufficient curing and thus has a problem of low reliability.

The problem occurs, since a color material such as a pigment, a dye, or the like competitively absorbs light energy with a photopolymerization initiator, and in addition, the photosensitive resin composition may not have sufficient initiation efficiency and accordingly, show a lower curing rate of a photopolymerizable monomer than one not using the color material, since the pigment and the dye remove a radical produced therein.

Accordingly, an effort to develop a photosensitive resin composition capable of remarkably improving reliability such as chemical resistance, heat resistance, and the like is being continuously made by using a different material instead of the conventional color material such as a dye, a pigment, or the like.

SUMMARY OF THE INVENTION

An embodiment provides a quantum dot-containing photosensitive resin composition that may maintain high absolute quantum efficiency after a color filter manufacturing process.

Another embodiment provides a photosensitive organic layer manufactured using the photosensitive resin composition.

Yet another embodiment provides a color filter including the photosensitive organic layer.

An embodiment provides a photosensitive resin composition including (A) a quantum dot; (B) a binder resin including a structural unit represented by Chemical Formula 1; (C) a photopolymerizable monomer; (D) a photopolymerization initiator; and (E) a solvent.

[Chemical Formula 1]

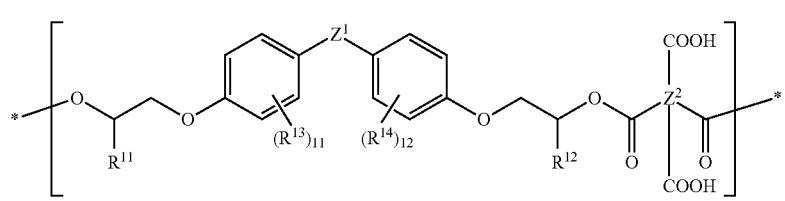

In Chemical Formula 1,
$R^{11}$ and $R^{12}$ are independently represented by Chemical Formula 2, $$*\text{-}L^1\text{-}L^2\text{-}R^1 \quad \text{[Chemical Formula 2]}$$

wherein, in Chemical Formula 2,
$L^1$ is a substituted or unsubstituted C1 to C10 alkylene group,
$L^2$ is an oxygen atom or a sulfur atom,
$R^1$ is "a C1 to C10 alkyl group substituted with a C1 to C10 alkylthio group" or "a C6 to C20 aryl group substituted with a C1 to C10 alkylthio group",
$R^{13}$ and $R^{14}$ are independently a hydrogen atom, a halogen atom, or a substituted or unsubstituted C1 to C20 alkyl group, and
$Z^1$ is a single bond, O, CO, $SO_2$, $CR^{17}R^{18}$, $SiR^{19}R^{20}$ (wherein, $R^{17}$ to $R^{20}$ are independently a hydrogen atom or a substituted or unsubstituted C1 to C20 alkyl group), or one of linking groups represented by Chemical Formula 1-1 to Chemical Formula 1-11,

[Chemical Formula 1-1]

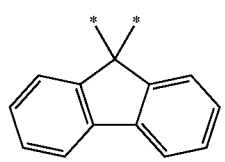

[Chemical Formula 1-2]

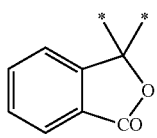

[Chemical Formula 1-3]

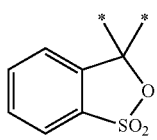

[Chemical Formula 1-4]

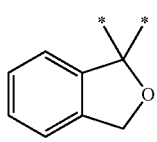

[Chemical Formula 1-5]

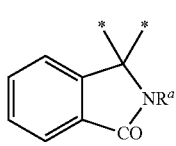

wherein, in Chemical Formula 1-5, $R^a$ is a hydrogen atom, an ethyl group, $C_2H_4Cl$, $C_2H_4OH$, $CH_2CH\!=\!CH_2$, or a phenyl group,

[Chemical Formula 1-6]

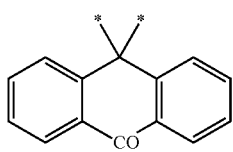

[Chemical Formula 1-7]

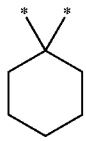

[Chemical Formula 1-8]

[Chemical Formula 1-9]

[Chemical Formula 1-10]

[Chemical Formula 1-11]

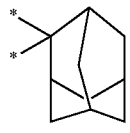

$Z^2$ is an acid anhydride residual group, and t1 and t2 are independently an integer ranging from 0 to 4.

The $R^1$ may be "a C1 to C5 alkyl group substituted with a C1 to C5 alkylthio group" or "a C6 to C10 aryl group substituted with a C1 to C5 alkylthio group".

The $Z^2$ may be represented by one selected from Chemical Formula 3 to Chemical Formula 5.

[Chemical Formula 3]

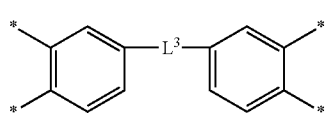

[Chemical Formula 4]

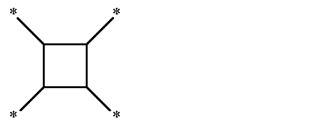

[Chemical Formula 5]

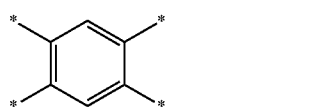

In Chemical Formula 3, $L^3$ is a single bond, an oxygen atom, a sulfur atom, *—C(=O)—*, or *—$CR^2R^3$—* (wherein $R^2$ and $R^3$ are independently a halogen atom-substituted or unsubstituted C1 to C10 alkyl group.

The binder resin may include at least two structural units represented by Chemical Formula 1.

The binder resin may have a weight average molecular weight of 2,000 g/mol to 20,000 g/mol.

The photosensitive resin composition may further include an acryl-based binder resin.

The photosensitive resin composition may further include (F) a scatterer.

The scatterer may include barium sulfate, calcium carbonate, titanium dioxide, zirconia, or a combination thereof.

The scatterer may be included in an amount of 0.5 wt % to 10 wt % based on a total amount of the photosensitive resin composition.

The photosensitive resin composition may further include a thiol-based additive.

The thiol-based additive may include at least two functional groups represented by Chemical Formula 7 at the terminal end.

[Chemical Formula 7]

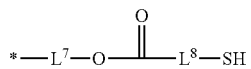

In Chemical Formula 7, $L^7$ and $L^8$ are independently a single bond, a substituted or unsubstituted C1 to C20 alkylene group, a substituted or unsubstituted C3 to C20 cycloalkylene group, a substituted or unsubstituted C6 to C20 arylene group, or a substituted or unsubstituted C2 to C20 heteroarylene group.

The quantum dot may absorb light of 360 nm to 780 nm and emit fluorescence of 500 nm to 700 nm.

The photosensitive resin composition may include 1 wt % to 30 wt % of (A) the quantum dot; 1 wt % to 30 wt % of (B) the binder resin; 1 wt % to 10 wt % of (C) the photopolymerizable monomer; 0.1 wt % to 5 wt % of (D) the photopolymerization initiator; and a balance amount of (E) the solvent based in a total amount of the photosensitive resin composition.

The photosensitive resin composition may further include malonic acid; 3-amino-1,2-propanediol; a silane-based coupling agent; a leveling agent; a fluorine-based surfactant; or a combination thereof.

Another embodiment provides a photosensitive resin layer manufactured using the photosensitive resin composition.

Another embodiment provides a color filter including the photosensitive resin layer.

Other embodiments of the present invention are included in the following detailed description.

After a manufacture process for a color filter including an exposure, a development, curing, and the like, a photosensitive resin composition including a photo-conversion material such as a quantum dot and the like may be minimized from deterioration of absolute quantum efficiency.

DETAILED DESCRIPTION

Hereinafter, embodiments of the present invention are described in detail. However, these embodiments are exemplary, the present invention is not limited thereto and the present invention is defined by the scope of claims.

In the present specification, when specific definition is not otherwise provided, "alkyl group" refers to a C1 to C20 alkyl group, "alkenyl group" refers to a C2 to C20 alkenyl group, "cycloalkenyl group" refers to a C3 to C20 cycloalkenyl group, "heterocycloalkenyl group" refers to a C3 to C20 heterocycloalkenyl group, "aryl group" refers to a C6 to C20 aryl group, "arylalkyl group" refers to a C6 to C20 arylalkyl group, "alkylene group" refers to a C1 to C20 alkylene group, "arylene group" refers to a C6 to C20 arylene group, "alkylarylene group" refers to a C6 to C20 alkylarylene group, "heteroarylene group" refers to a C3 to C20 heteroarylene group, and "alkoxylene group" refers to a C1 to C20 alkoxylene group.

In the present specification, when specific definition is not otherwise provided, "substituted" may refer to substitution with a halogen atom (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof, instead of at least one hydrogen.

In the present specification, when specific definition is not otherwise provided, "hetero" may refer to one substituted with at least one hetero atom of N, O, S and P, in a chemical formula.

In the present specification, when specific definition is not otherwise provided, "(meth)acrylate" refers to both "acrylate" and "methacrylate", and "(meth)acrylic acid" refers to "acrylic acid" and "methacrylic acid".

In the present specification, when specific definition is not otherwise provided, "combination" refers to mixing or copolymerization.

In the present specification, unless a specific definition is otherwise provided, a hydrogen atom is boned at the position when a chemical bond is not drawn where supposed to be given.

In the present specification, when specific definition is not otherwise provided, "*" indicates a point where the same or different atom or Chemical Formula is linked.

A photosensitive resin composition according to an embodiment includes (A) a quantum dot; (B) a binder resin including a structural unit represented by Chemical Formula 1; (C) a photopolymerizable monomer; (D) a photopolymerization initiator; and (E) a solvent.

[Chemical Formula 1]

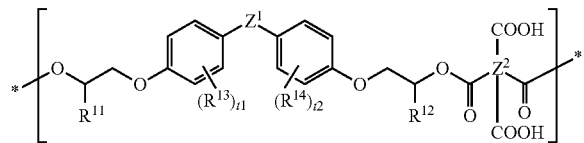

In Chemical Formula 1, $R^{11}$ and $R^{12}$ are independently represented by Chemical Formula 2,

*-$L^1$-$L^2$-$R^1$      [Chemical Formula 2]

wherein, in Chemical Formula 2, $L^1$ is a substituted or unsubstituted C1 to C10 alkylene group, $L^2$ is an oxygen atom or a sulfur atom, $R^1$ is "a C1 to C10 alkyl group substituted with a C1 to C10 alkylthio group" or "a C6 to C20 aryl group substituted with a C1 to C10 alkylthio group", $R^{13}$ and $R^{14}$ are independently a hydrogen atom, a halogen atom, or a substituted or unsubstituted C1 to C20 alkyl group, and $Z^1$ is a single bond, O, CO, $SO_2$, $CR^{17}R^{18}$, $SiR^{19}R^{20}$ (wherein, $R^{17}$ to $R^{20}$ are independently a hydrogen atom or a substituted or unsubstituted C1 to C20 alkyl group), or one of linking groups represented by Chemical Formula 1-1 to Chemical Formula 1-11,

[Chemical Formula 1-1]

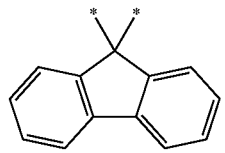

[Chemical Formula 1-2]

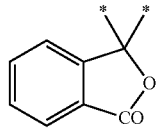

[Chemical Formula 1-3]

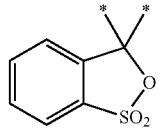

[Chemical Formula 1-4]

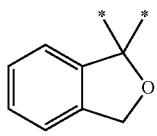

[Chemical Formula 1-5]

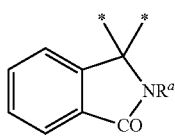

wherein, in Chemical Formula 1-5, $R^a$ is a hydrogen atom, an ethyl group, $C_2H_4Cl$, $C_2H_4OH$, $CH_2CH=CH_2$, or a phenyl group,

[Chemical Formula 1-6]

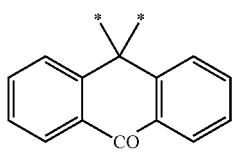

[Chemical Formula 1-7]

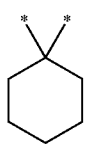

[Chemical Formula 1-8]

[Chemical Formula 1-9]

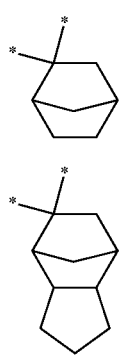

[Chemical Formula 1-10]

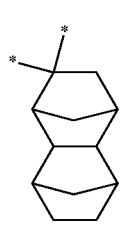

[Chemical Formula 1-11]

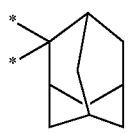

$Z^2$ is an acid anhydride residual group, and t1 and t2 are independently an integer ranging from 0 to 4.

The photosensitive resin composition according to an embodiment includes a binder resin including a structural unit represented by Chemical Formula 1 and thus may be minimized from deterioration of a photo-conversion rate during a heat treatment for manufacturing a color filter. Specifically, an oxygen atom or a sulfur atom (more specifically, a sulfur atom) of the $L^2$ and a sulfur atom of the $R^1$ work as a ligand on the surface of a quantum dot and thus may bind them or passivate the quantum dot and thus may improve dispersibility and stability of the quantum dot and ultimately, prevent deterioration of the photo-conversion rate.

Hereinafter, each component is specifically described.

(A) Quantum Dot

The quantum dot may absorb light in a wavelength region of 360 nm to 780 nm, for example 400 nm to 780 nm and emit fluorescence in a wavelength region of 500 nm to 700 nm, for example, 500 nm to 580 nm, or 600 nm to 680 nm. That is, the photo-conversion material may have a maximum fluorescence wavelength (fluorescence $\lambda_{em}$) in a wavelength of 500 nm to 680 nm.

The quantum dot may independently have a full width at half maximum (FWHM) in a range of 20 nm to 100 nm, for example, 20 nm to 50 nm. When the quantum dot has a full width at half maximum (FWHM) within the ranges, the quantum dot has high color purity and thus an effect on increasing color reproducibility when used as a color material in a color filter.

The quantum dot may independently be an organic material, an inorganic material, or a hybrid (mixture) of the organic material and the inorganic material.

The quantum dot may independently include a core and a shell surrounding the core, and herein, the core and the shell may have a structure such as a core independently comprising II—IV groups, III-V groups, and the like, a core/a shell, a core/a first shell/a second shell, an alloy, an alloy/a shell, and the like but are not limited thereto.

For example, the core may include at least one material selected from CdS, CdSe, CdTe, ZnS, ZnSe, ZnTe, HgS, HgSe, HgTe, GaN, GaP, GaAs, InP, InAs, and an alloy thereof but is not necessarily limited thereto. The shell surrounding the core may include at least one material selected from CdSe, ZnSe, ZnS, ZnTe, CdTe, PbS, TiO, SrSe, HgSe, and an alloy thereof but is not necessarily limited thereto.

In an embodiment, since an interest in an environment has been recently much increased over the whole world, and a regulation of a toxic material also has been fortified, a non-cadmium-based light emitting material (InP/ZnS) having little low quantum efficiency (quantum yield) but being environmentally-friendly instead of a light emitting material having a cadmium-based core is used but not necessarily limited thereto.

A structure of the quantum dot is not particularly limited, but the quantum dot having a core/shell structure may have an entire size including the shell (an average particle diameter) of 1 nm to 15 nm, for example, 5 nm to 15 nm For example, the quantum dot may independently include a red quantum dot, a green quantum dot, or a combination thereof. The red quantum dot may independently have an average particle diameter of 10 nm to 15 nm. The green quantum dot may independently have an average particle diameter of 5 nm to 8 nm.

On the other hand, for dispersion stability of the quantum dot, a photosensitive resin composition according to an embodiment may further include a dispersing agent. The dispersing agent helps uniform dispersion of a photo-conversion material such as a quantum dot in the photosensitive resin composition and may include a non-ionic, anionic, or cationic dispersing agent. Specifically, the dispersing agent may be polyalkylene glycol or esters thereof, a polyoxy alkylene, a polyhydric alcohol ester alkylene oxide addition product, an alcohol alkylene oxide addition product, a sulfonate ester, a sulfonate salt, a carboxylate ester, a carboxylate salt, an alkyl amide alkylene oxide addition product, an alkyl amine and the like, and they may be used alone or in a mixture of two or more. The dispersing agent may be used in an amount of 0.1 wt % to 100 wt %, for example 10 wt % to 20 wt % relative to a solid content of the photo-conversion material such as a quantum dot.

The quantum dot may be included in an amount of 1 wt % to 30 wt %, for example 5 wt % to 15 wt % based on a total amount of the photosensitive resin composition according to an embodiment. When the quantum dot is included within the ranges, a photo-conversion rate is improved and excellent processibility may be provided by not decreasing pattern characteristics and development characteristics.

(B) Binder Resin

The binder resin includes the structural unit represented by Chemical Formula 1.

For example, the $R^1$ may be a C1 to C5 alkyl group substituted with a C1 to C5 alkylthio group or a C6 to C10 aryl group substituted with a C1 to C5 alkylthio group.

For example, the $Z^2$ may be represented by one selected from Chemical Formula 3 to Chemical Formula 5.

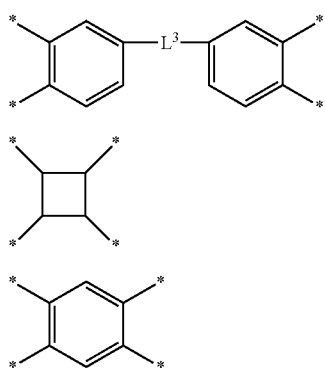

[Chemical Formula 3]

[Chemical Formula 4]

[Chemical Formula 5]

In Chemical Formula 3, $L^3$ is a single bond, an oxygen atom, a sulfur atom, *—C(=O)—*, or *—$CR^2R^3$—* (wherein $R^2$ and $R^3$ are independently a halogen atom-substituted or unsubstituted C1 to C10 alkyl group.

For example, in Chemical Formula 3, $L^3$ may be a sulfur atom.

The binder resin may include at least two structural units represented by Chemical Formula 1.

The binder resin may have a weight average molecular weight of 2,000 g/mol to 20,000 g/mol, for example a weight average molecular weight of 3,000 g/mol to 10,000 g/mol. When the weight average molecular weight of the binder resin is within the ranges, a pattern may be well formed without a residue during manufacture of a color filter and without loss of a film thickness during development.

The binder resin may include a functional group represented by Chemical Formula 10 at at least one of both terminal ends.

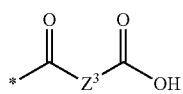

[Chemical Formula 10]

In Chemical Formula 10, $Z^3$ is represented by Chemical Formula 10-1 to Chemical Formula 10-7.

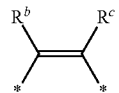

[Chemical Formula 10-1]

(wherein, in Chemical Formula 10-1, $R^b$ and $R^c$ are independently a hydrogen atom, a substituted or unsubstituted C1 to C20 alkyl group, an ester group, or an ether group.)

[Chemical Formula 10-2]

[Chemical Formula 10-3]

[Chemical Formula 10-4]

[Chemical Formula 10-5]

(wherein, in Chemical Formula 10-5, $R^d$ is O, S, NH, a substituted or unsubstituted C1 to C20 alkylene group, C1 to C20 alkylamine group, or C2 to C20 alkenylamine group.)

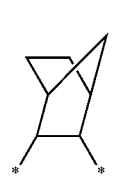

[Chemical Formula 10-6]

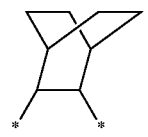

[Chemical Formula 10-7]

The photosensitive resin composition according to an embodiment may further include an acryl-based binder resin.

The acryl-based binder resin is a copolymer of a first ethylenic unsaturated monomer and a second ethylenic unsaturated monomer copolymerizable therewith, and may be a resin including at least one acryl-based repeating unit.

The first ethylenic unsaturated monomer is an ethylenic unsaturated monomer including at least one carboxyl group.

Examples of the monomer include acrylic acid, methacrylic acid, maleic acid, itaconic acid, fumaric acid, or a combination thereof.

The first ethylenic unsaturated monomer may be included in an amount of 5 wt % to 50 wt %, for example 10 wt % to 40 wt % based on a total amount of the acryl-based binder resin.

The second ethylenic unsaturated monomer may be an aromatic vinyl compound such as styrene, α-methylstyrene, vinyltoluene, vinylbenzylmethylether, and the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; an unsaturated carboxylic acid amino alkyl ester compound such as 2-aminoethyl (meth)acrylate, 2-dimethylaminoethyl(meth)acrylate, and the like; a carboxylic acid vinyl ester compound such as vinyl acetate, vinyl benzoate, and the like; an unsaturated carboxylic acid glycidyl ester compound such as glycidyl (meth)acrylate, and the like; a vinyl cyanide compound such as (meth)acrylonitrile, and the like; an unsaturated amide compound such as (meth)acrylamide, and the like; and the like, and these may be used alone or in a mixture of two or more.

Specific examples of the acryl-based binder resin may be a polybenzylmethacrylate, (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, and the like, but are not limited thereto and these may be used alone or in a mixture of two or more.

A weight average molecular weight of the acryl-based binder resin may be 5,000 g/mol to 20,000 g/mol. When the acryl-based binder resin has a weight average molecular weight within the range, close-contacting properties to a substrate, and physical and chemical properties are improved and viscosity is appropriate.

The acryl-based binder resin may have an acid value of 80 mgKOH/g to 130 mgKOH/g. When the acryl-based binder resin has an acid value within the range, a pixel has excellent resolution.

The binder resin may be included in an amount of 1 wt % to 30 wt %, for example 10 wt % to 20 wt % based on a total amount of photosensitive resin composition. When the binder resin is included within the ranges, excellent sensitivity, developability, resolution and linearity of a pattern may be obtained.

(C) Photopolymerizable Monomer

The photopolymerizable monomer may be mono-functional or multi-functional ester of (meth)acrylic acid including at least one ethylenic unsaturated double bond.

The photopolymerizable monomer has the ethylenic unsaturated double bond and thus, may cause sufficient polymerization during exposure in a pattern-forming process and form a pattern having excellent heat resistance, light resistance, and chemical resistance.

Specific examples of the photopolymerizable monomer may be ethylene glycol di(meth)acrylate, diethylene glycol di(meth)acrylate, triethylene glycol di(meth)acrylate, propylene glycol di(meth)acrylate, neopentyl glycol di(meth) acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth) acrylate, dipentaerythritol di(meth)acrylate, dipentaerythritol tri(meth)acrylate, dipentaerythritol penta (meth)acrylate, dipentaerythritol hexa(meth)acrylate, bisphenolA epoxy(meth)acrylate, ethylene glycol monomethyl ether (meth)acrylate, trimethylol propane tri(meth)acrylate, tris(meth)acryloyloxyethyl phosphate, novolac epoxy (meth)acrylate, and the like.

Commercially available products of photopolymerizable monomer are as follows. Examples of the mono-functional ester of (meth)acrylic acid may include Aronix M-101®, M-111®, and M-114® of Toagosei Chemistry Industry Co., Ltd.; KAYARAD TC-110S®, and TC-120S® of Nippon Kayaku Co., Ltd.; V-158® and V-2311® of Osaka Organic Chemical Ind., Ltd., and the like. Examples of a di-functional ester of (meth)acrylic acid may include Aronix M-210®, M-240®, and M-6200® of Toagosei Chemistry Industry Co., Ltd.; KAYARAD HDDA®, HX-220®, R-604® of Nippon Kayaku Co., Ltd.; V-260®, V-312®, and V-335 HP® of Osaka Organic Chemical Ind., Ltd., and the like. Examples of a tri-functional ester of (meth)acrylic acid may include Aronix M-309®, M-400®, M-405, M-450®, M-7100®, M-8030®, and M-8060® of Toagosei Chemistry Industry Co., Ltd.; KAYARAD TMPTA®, DPCA-20®, DPCA-30®, DPCA-60®, and DPCA-120® of Nippon Kayaku Co., Ltd.; V-295®, V-300®, V-360®, V-GPT®, V-3PA, V-400® of Osaka Yuki Kayaku Kogyo Co. Ltd., and the like These may be used alone or in a mixture of two or more.

The photopolymerizable monomer compound may be treated with acid anhydride to improve developability.

The photopolymerizable monomer may be included in an amount of 1 wt % to 10 wt %, for example 1 wt % to 5 wt % based on a total amount of the photosensitive resin composition. When the photopolymerizable monomer is included within the range, the photopolymerizable monomer is sufficiently cured during exposure in a pattern-forming process and thus reliability is improved and heat resistance, light resistance, chemical resistance, resolution and a close contacting property of a pattern may be improved.

(D) Photopolymerization Initiator

The photopolymerization initiator may be a generally-used initiator for a photosensitive resin composition, and may be, for example an acetophenone-based compound, a benzophenone-based compound, a thioxanthone-based compound, a benzoin-based compound, a triazine-based compound, an oxime-based compound, and the like.

Examples of the acetophenone-based compound may be 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may be benzophenone, benzoyl benzoate, benzoyl methyl benzoate, 4-phenyl benzophenone, hydroxybenzophenone, acrylated benzophenone, 4,4'-bis(dimethyl amino)benzophenone, 4,4'-bis(diethylamino)benzophenone, 4,4'-dimethylamino-benzophenone, 4,4'-dichlorobenzophenone, 3,3'-dimethyl-2-methoxybenzophenone, and the like.

Examples of the thioxanthone-based compound may be thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compound may be benzoin, benzoin methyl ether, benzoin ethyl ether, benzoin isopropyl ether, benzoin isobutyl ether, benzyldimethylketal, and the like.

Examples of the triazine-based compound may be 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl-4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime-based compound may be O-acyloxime-based compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, 0-ethoxycarbonyl-α-oxyamino-1-phenylpropan-1-one, and the like. Specific examples of the O-acyloxime-based compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, and 1-(4-phenylsulfanyl phenyl)-butan-1-oneoxime-O-acetate.

The photopolymerization initiator may further include a carbazole-based compound, a diketone-based compound, a sulfonium borate-based compound, a diazo-based compound, an imidazole-based compound, a biimidazole-based compound, and the like besides the compounds.

The photopolymerization initiator may be used with a photosensitizer capable of causing a chemical reaction by absorbing light and becoming excited and then, transferring its energy.

Examples of the photosensitizer may be tetraethylene glycol bis-3-mercapto propionate, pentaerythritol tetrakis-3-mercapto propionate, dipentaerythritol tetrakis-3-mercapto propionate, and the like.

The photopolymerization initiator may be included in an amount of 0.1 wt % to 5 wt %, for example 0.1 wt % to 3 wt % based on a total amount of the photosensitive resin composition. When the photopolymerization initiator is included within the ranges, excellent reliability may be secured due to sufficiently curing during exposure in a pattern-forming process, a pattern may have excellent heat resistance, light resistance, chemical resistance, resolution, and a close contacting property, and transmittance may be prevented from deterioration due to a non-reaction initiator.

(E) Solvent

The solvent is a solvent having compatibility with the quantum dot and a material having compatibility with the binder resin, the photopolymerizable monomer, the photopolymerization initiator, and other additives but not reacting therewith.

Examples of the solvent having compatibility with the quantum dot may be, for example, alkanes (R—H) such as pentane, hexane, heptanes, and the like; aromatic hydrocarbons (Ar—H) such as toluene, xylene, and the like; ethers (R—O—R) such as diisoamyl ether, dibutyl ether, and the like; alkyl halides (R—X) such as chloroform, trichloro methane, and the like; cycloalkanes such as cyclopropane, cyclobutane, cyclopentane, cyclohexane, and the like; and the like, but are not limited thereto.

Examples of the solvent having compatibility with the binder resin, the photopolymerizable monomer, the photopolymerization initiator, and other additives may be, for example, alcohols such as methanol, ethanol, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol monomethylether acetate, propylene glycol propylether acetate, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid alkyl esters such as methyl lactate, ethyl lactate, and the like; hydroxyacetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; or ketonate ester compounds such as ethyl pyruvate and the like, and a high-boiling point solvent such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may be also used, but is not limited thereto.

Considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol monomethylether acetate, propylene glycol propylether acetate, and the like may be used.

The solvent having compatibility with the binder resin, the photopolymerizable monomer, the photopolymerization initiator, and other additives may be used 1 to 3 times, for example 1 to 2 times as much as a solvent having compatibility with the quantum dot. Herein, developability of the photosensitive resin composition depending on an alkali developing solution may be effectively adjusted.

The solvent may be included in a balance amount, for example 30 wt % to 80 wt %, for example 40 wt % to 75 wt % based on a total amount of the photosensitive resin composition. When the solvent is within the range, the photosensitive resin composition has appropriate viscosity and thus processibility is improved during a manufacture of a color filter.

(F) Scatterer

A photosensitive resin composition according to an embodiment may further include a scatterer.

For example, the scatterer may include barium sulfate ($BaSO_4$), calcium carbonate ($CaCO_3$), titanium dioxide ($TiO_2$), zirconia ($ZrO_2$), or a combination thereof.

The scatterer reflects light not absorbed in the above photo-conversion material, so that the reflected light may be absorbed again in the photo-conversion material. In other words, the scatterer increases a dose of the light absorbed in the photo-conversion material and thus photo-conversion efficiency of the photosensitive resin composition.

The scatterer may have an average particle diameter (D50) of 150 nm to 250 nm, and specifically 180 nm to 230 nm. When the scatterer has an average particle diameter within the ranges, much more excellent light scattering effects may be obtained, and photo-conversion efficiency may be increased.

The scatterer, specifically the solid scatterer may be included in an amount of 0.5 wt % to 10 wt %, for example 1 wt % to 8 wt % based on a total weight of the photosensitive resin composition. When the scatterer is included in an amount of less than 0.5 wt % based on a total weight of the photosensitive resin composition, the scattering effect of improving photo-conversion efficiency may be difficult to obtain, while when the scatterer is included in an amount of greater than 10 wt %, pattern characteristics of a color filter may be deteriorated and photo-conversion efficiency may also be deteriorated.

(G) Other Additives

In order to improve stability and dispersibility of the quantum dot, the photosensitive resin composition according to an embodiment may further include a thiol-based additive.

The thiol-based additive may replace the shell surface of the quantum dot, and may improve dispersion stability of a quantum dot in a solvent and may stabilize the quantum dot.

The thiol-based additive may have 2 to 10, for example 2 to 4 thiol groups (—SH) at the terminal end according to its structure.

For example, the thiol-based additive may include at least two functional groups represented by Chemical Formula 7 at the terminal end.

[Chemical Formula 7]

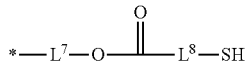

In Chemical Formula 7, $L^7$ and $L^8$ are independently a single bond, a substituted or unsubstituted C1 to C20 alkylene group, a substituted or unsubstituted C3 to C20 cycloalkylene group, a substituted or unsubstituted C6 to C20 arylene group, or a substituted or unsubstituted C2 to C20 heteroarylene group.

For example, the thiol-based additive may be represented by Chemical Formula 8.

[Chemical Formula 8]

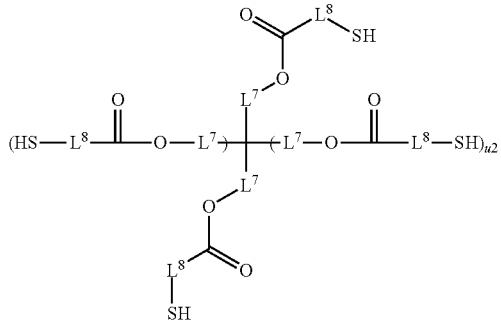

In Chemical Formula 8, $L^7$ and $L^8$ are independently a single bond, a substituted or unsubstituted C1 to C20 alkylene group, a substituted or unsubstituted C3 to C20 cycloalkylene group, a substituted or unsubstituted C6 to C20 arylene group, or a substituted or unsubstituted C2 to C20 heteroarylene group, and u1 and u2 are independently an integer of 0 or 1.

For example, in Chemical Formula 7 and Chemical Formula 8, the $L^1$ and $L^2$ may independently be a single bond or a substituted or unsubstituted C1 to C20 alkylene group.

Specific examples of the thiol-based additive may be selected from pentaerythritol tetrakis(3-mercaptopropionate) represented by Chemical Formula 8a, trimethylolpropane tris(3-mercaptopropionate) represented by Chemical Formula 8b, pentaerythritol tetrakis(mercaptoacetate) represented by Chemical Formula 8c, trimethylolpropane tris(2-mercaptoacetate) represented by Chemical Formula 8d, glycol di-3-mercaptopropionate represented by Chemical Formula 8e, and a combination thereof.

[Chemical Formula 8a]

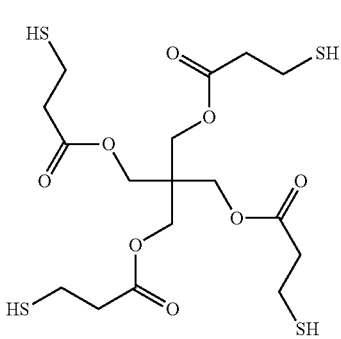

[Chemical Formula 8b]

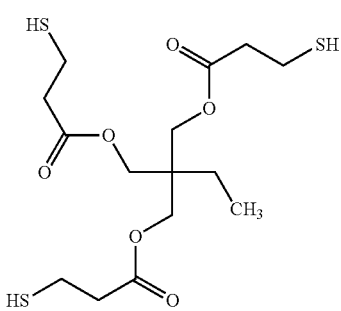

[Chemical Formula 8c]

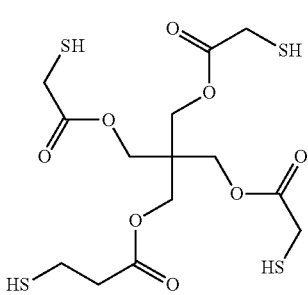

[Chemical Formula 8d]

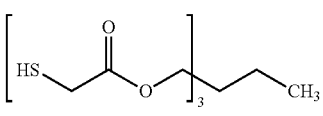

[Chemical Formula 8e]

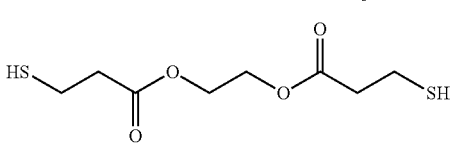

The thiol-based additive may be included in an amount of 0.1 wt % to 10 wt %, for example 0.1 wt % to 5 wt % based on a total amount of photosensitive resin composition. When the thiol-based additive is included within the ranges, stability of a photo-conversion material such as a quantum dot may be improved, the thiol group in the component reacts with an acrylic group of a resin or a monomer to form a covalent bond and thereby heat resistance of a photo-conversion material such as a quantum dot may be improved.

A photosensitive resin composition according to an embodiment may further include malonic acid; 3-amino-1, 2-propanediol; a silane-based coupling agent; a leveling agent; a fluorine-based surfactant; or a combination thereof, besides the thiol-based additive.

For example, the photosensitive resin composition may further include a silane-based coupling agent having a reactive substituent such as a vinyl group, a carboxyl group, a methacryloxy group, an isocyanate group, an epoxy group and the like in order to improve close contacting properties with a substrate.

Examples of the silane-based coupling agent may be trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl)ethyltrimethoxysilane, and the like, and these may be used alone or in a mixture of two or more.

The silane-based coupling agent may be used in an amount of 0.01 parts by weight to 10 parts by weight based on 100 parts by weight of the photosensitive resin composition. When the silane-based coupling agent is included within the range, close contacting properties, storage capability, and the like are improved.

The photosensitive resin composition may further include a surfactant, for example a fluorine-based surfactant as needed in order to improve coating properties and inhibit generation of spots.

Examples of the fluorine-based surfactant may be, BM-1000®, and BM-1100® (BM Chemie Inc.); MEGAFACE F 142D®, F 172®, F 173®, and F 183® Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (ASAHI Glass Co., Ltd.); and SH-28PA®, SH-190®, SH-193®, SZ-6032®, and SF-8428®, and the like (Toray Silicone Co., Ltd.); F-482, F-484, F-478, F-554, and the like of DIC Co., Ltd.

The fluorine-based surfactant may be included in an amount of 0.001 parts by weight to 5 parts by weight based on 100 parts by weight of the photosensitive resin composition. When the fluorine-based surfactant is included within the range, coating uniformity may be ensured, stains are not generated, and wetting properties for a glass substrate are improved.

The photosensitive resin composition may further include other additives such as an antioxidant, a stabilizer, and the like in a predetermined amount as long as they do not reduce properties.

Another embodiment provides a photosensitive resin layer manufactured using the photosensitive resin composition is provided.

A method of manufacturing the photosensitive resin layer is as follows.

(1) Coating and Film Formation Steps

The photosensitive resin composition is coated to have a desired thickness, for example, a thickness ranging from 1.2 μm to 3.5 μm, on a substrate which undergoes a predetermined pretreatment, using a spin or slit coating method, a roll coating method, a screen-printing method, an applicator method, and the like, and then the coated substrate is heated at a temperature ranging from 70° C. to 90° C. for 1 minute to 10 minutes to remove a solvent.

(2) Exposure Step

The resultant film is radiated by an active ray such as UV ray of 200 nm to 500 nm after putting a mask with a predetermined shape to form a desired pattern. The radiation is performed by using a light source such as a mercury lamp with a low pressure, a high pressure, or an ultrahigh pressure, a metal halide lamp, an argon gas laser, and the like. An X ray, an electron beam, and the like may be also used as needed.

A light dose of 500 mJ/cm$^2$ or less (with a 365 nm sensor) may be used when a high pressure mercury lamp is used, but the light dose may vary depending on kinds of each component of the photosensitive resin composition, its combination ratio, and a dry film thickness.

(3) Development Step

After the exposure process, an alkali aqueous solution is used to develop the exposed film by dissolving and removing an unnecessary part except the exposed part, forming an image pattern.

(4) Post-Treatment Step

The developed image pattern may be heated again or radiated by an active ray and the like for curing, in order to accomplish excellent quality in terms of heat resistance, photo resistance, close contacting properties, crack-resistance, chemical resistance, high strength, storage stability, and the like.

Another embodiment provides a color filter including the photosensitive resin layer.

Hereinafter, examples of the present disclosure are described. These examples, however, are not in any sense to be interpreted as limiting the scope of the invention.

Preparation of Binder Resin

Synthesis Example 1-1

A compound represented by Chemical Formula A-1 was synthesized by putting 138 g of 9,9'-bis(4-glysiloxyphenyl) fluorine (Hear Chem), 54 g of 4-(methylthio)benzenethiol (TCl), 1.4 g of benzyltriethylammoniumchloride (Daejung Chemicals & Metals Co. Ltd.), 1 g of triphenylphosphine (Aldrich Corporation), 128 g of propylglycolmethylethylacetate (Daicel Chemicals Company), and 0.5 g of hydroquinone in a reactor and then, heating the reactor up to 120° C. and maintaining it for 12 hours.

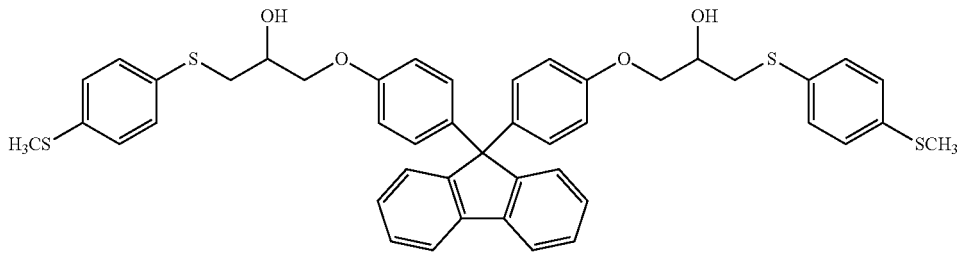

[Chemical Formula A-1]

Synthesis Example 1-2

A compound represented by Chemical Formula A-2 was synthesized by putting 138 g of 9,9'-bis(4-glysyloxyphenyl)fluorine (Hear Chem), 54 g of 2-(methylsulfanyl)ethane-1-thiol (TCI), 1.4 g of benzyltriethylammoniumchloride (Daejung Chemicals & Metals Co. Ltd.), 1 g of triphenylphosphine (Aldrich Corporation), 128 g of propylglycolmethylethylacetate (Daicel Chemicals Company), and 0.5 g of hydroquinone in a reactor and then, heating the reactor up to 120° C. and maintaining it for 12 hours.

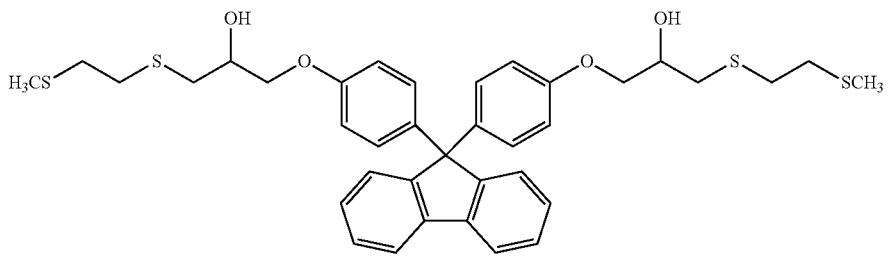

[Chemical Formula A-2]

Synthesis Example 2-1

A compound represented by Chemical Formula B-1 (a weight average molecular weight: 5,600 g/mol) was synthesized by putting 60 g of the compound represented by Chemical Formula A-1, 16 g of 3,3',4,4'-thiodiphthalic anhydride (American chemical Inc.), 3.4 g of 5-norbornene-2,3-dicarboxylic anhydride (TCI), 20 g of propylglycolmethylethylacetate (Daicel Chemicals Company), and 0.1 g of N,N'-tetramethylammonium chloride in a reactor and then, heating the reactor up to 120° C. and maintaining it for 2 hours.

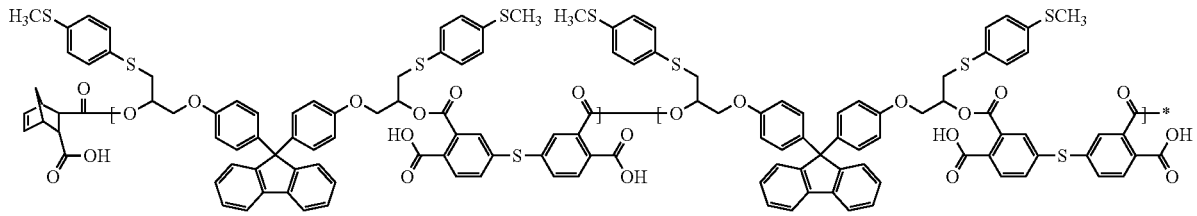

[Chemical Formula B-1]

Synthesis Example 2-2

A compound represented by Chemical Formula B-2 (a weight average molecular weight: 4,300 g/mol) was synthesized by putting 60 g of the compound represented by Chemical Formula A-1, 16 g of 1,2,3,4-cyclobutanetetracarboxylic dianhydride (TCI), 3.4 g of 5-norbornene-2,3-dicarboxylic anhydride (TCI), 20 g of propylglycolmethylethylacetate (Daicel Chemicals Company), and 0.1 g of N,N'-tetramethylammonium chloride in a reactor and then, heating the reactor up to 120° C. and maintaining it for 2 hours.

[Chemical Formula B-2]

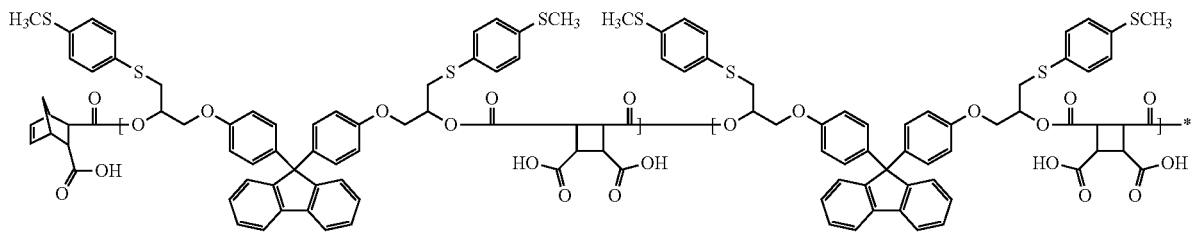

Synthesis Example 2-3

A compound represented by Chemical Formula B-3 (a weight average molecular weight: 5,400 g/mol) was synthesized by putting 60 g of the compound represented by Chemical Formula A-2, 16 g of 3,3',4,4'-thiodiphthalic anhydride (American chemical Inc.), 3.4 g of 5-norbornene-2,3-dicarboxylic anhydride (TCI), 20 g of propylglycolmethylethylacetate (Daicel Chemicals Company), and 0.1 g of N,N'-tetramethylammonium chloride in a reactor and then heating the reactor up to 120° C. and maintaining it for 2 hours.

[Chemical Formula B-3]

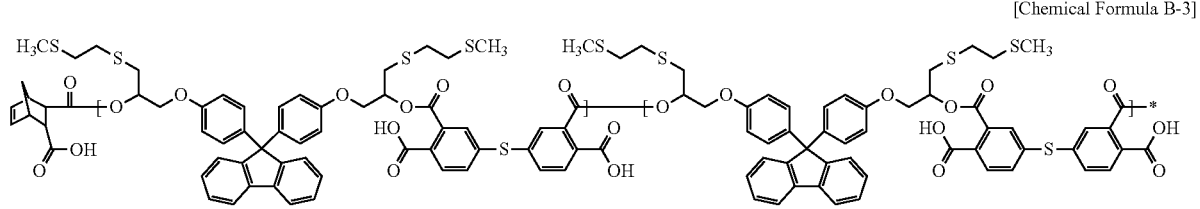

Synthesis Example 2-4

A compound represented by Chemical Formula B-4 (a weight average molecular weight: 4,200 g/mol) was synthesized by putting 60 g of the compound represented by Chemical Formula A-2, 16 g of 1,2,3,4-cyclobutanetetracarboxylic dianhydride (TCI), 3.4 g of 5-norbornene-2,3-dicarboxylic anhydride (TCI), 20 g of propylglycolmethylethylacetate (Daicel Chemicals Company), and 0.1 g of N,N'-tetramethylammonium chloride in a reactor and heating the reactor up to 120° C. and maintaining it for 2 hours.

[Chemical Formula B-4]

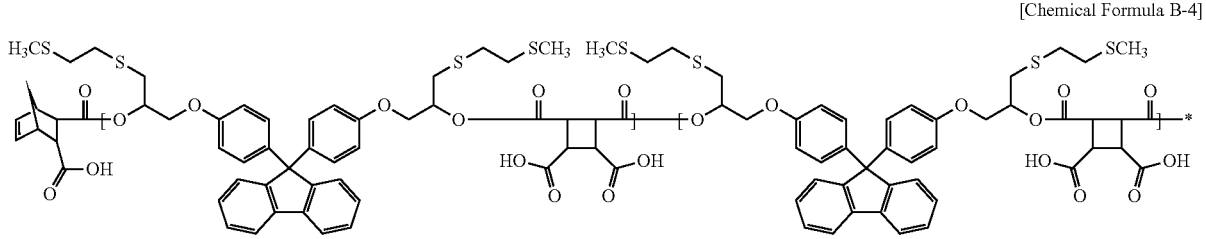

Preparation of Photosensitive Resin Composition

Examples 1 to 8 and Comparative Examples 1 and 2

The photosensitive resin compositions according to Examples 1 to 8 and Comparative Examples 1 and 2 were respectively prepared by using the following components shown in Table 1.

Specifically, a photopolymerization initiator was dissolved in a solvent (E-2), and the solution was sufficiently stirred at room temperature for 2 hours. Subsequently, a photopolymerizable monomer and a binder resin were added (E) Solvent
(E-1) Cyclohexanone (Sigma-Aldrich Corporation)
(E-2) Propylene glycol Monomethylether Acetate (PGMEA) (Sigma-Aldrich Corporation)
(F) Scatterer
Titanium Dioxide Dispersion (TiO$_2$ solid content: 20 wt %, Average particle diameter: 200 nm, Ditto Technology)
(G) Other Additives
(G-1) Thiol-based Additive (glycol di-3-mercaptopropionate, BRUNO BOCK)
(G-2) Fluorine-based Surfactant (F-554, DIC Co., Ltd.)

TABLE 1 unit: wt %

| | | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|---|
| (A) Quantum dot | (A-1) | 9 | 9 | — | — | 9 | 9 | 9 | 9 | 9 | — |
| | (A-2) | — | — | 9 | 9 | — | — | — | — | — | 9 |
| (B) Binder resin | (B-1) | 16 | — | 16 | — | — | — | 8 | 16 | — | — |
| | (B-2) | — | 16 | — | 16 | — | — | — | — | — | — |
| | (B-3) | — | — | — | — | 16 | — | — | — | — | — |
| | (B-4) | — | — | — | — | — | 16 | — | — | — | — |
| | (B-5) | — | — | — | — | — | — | 8 | — | — | — |
| | (B-6) | — | — | — | — | — | — | — | — | 16 | 16 |
| (C) Photopolymerizable monomer | | 3.5 | 3.5 | 3.5 | 3.5 | 3.5 | 3.5 | 3.5 | 3.5 | 3.5 | 3.5 |
| (D) Photopolymerization initiator | | 0.5 | 0.5 | 0.5 | 0.5 | 0.5 | 0.5 | 0.5 | 0.5 | 0.5 | 0.5 |
| (E) Solvent | E-1 | 22 | 22 | 22 | 22 | 22 | 22 | 22 | 22 | 22 | 22 |
| | E-2 | 33 | 33 | 33 | 33 | 33 | 33 | 33 | 33 | 33 | 33 |
| (F) Scatterer | | 15 | 15 | 15 | 15 | 15 | 15 | 15 | 15 | 15 | 15 |
| (G) Other additives | G-1 | — | — | — | — | — | — | — | 0.5 | — | — |
| | G-2 | 1 | 1 | 1 | 1 | 1 | 1 | 1 | 0.5 | 1 | 1 | thereto, and the mixture was stirred at room temperature for 1 hour. On the other hand, a quantum dot and a dispersing agent were added to a solvent E-1 and then, stirred therewith at room temperature for 30 minutes to prepare a quantum dot solution. Then, the quantum dot solution was mixed with the former solution in which the photopolymerization initiator and the like were dissolved in the solvent E-2, a scatterer, a thiol-based additive, and a fluorine-based surfactant were added thereto, the obtained mixture was stirred at room temperature for one hour, and a product therein was three times filtered to remove impurities to respectively prepare the photosensitive resin compositions.

(A) Quantum Dot
(A-1) InP/ZnS quantum dot (fluorescence $\lambda_{em}$=635 nm, FWHM=40 nm, Red QD, Hansol Chemical Co., Ltd.)
(A-2) InP/ZnS quantum dot (fluorescence $\lambda_{em}$=535 nm, FWHM=40 nm, Green QD, Hansol Chemical Co., Ltd.)
(B) Binder Resin
(B-1) Binder Resin prepared in Synthesis Example 2-1
(B-2) Binder Resin prepared in Synthesis Example 2-2
(B-3) Binder Resin prepared in Synthesis Example 2-3
(B-4) Binder Resin prepared in Synthesis Example 2-4
(B-5) Acryl-based Binder Resin (SP-RY16, Showa Denko K.K.)
(B-6) Cardo-based Binder Resin (V259ME, Nippon Steel Chemical Co., Ltd.)
(C) Photopolymerizable Monomer
Dipentaerythritol Hexaacrylate (Nippon Kayaku Co. Ltd.)
(D) Photopolymerization Initiator
Oxime-based Photopolymerization Initiator (OXE02, BASF)

Evaluation: Photo-Conversion Rate and Process Maintenance Rate of Quantum Dot 15 ml of each photosensitive resin composition according to Examples 1 to 8 and Comparative Examples 1 and 2 was respectively coated to be 6.0 μm-thick single films on a glass substrate using a spin-coater (Opticoat MS-A150, Mikasa Co., Ltd.) and soft-baked on a hot-plate at 100° C. for 3 minutes, and their initial blue photo-conversion rates were measured.

Then, the coated photosensitive resin compositions were radiated by UV with an exposer (ghi broadband, Ushio Inc.) with a power of 100 mJ/cm$^2$ and hard-baked in a convection oven at 180° C. for 30 minutes, and their blue photo-conversion rates were measured.

As for the soft-baking and hard-baking, a photo-conversion rate from blue light entering from BLU into green light and a process maintenance rate were evaluated, and the results are shown in Table 2. Herein, the blue photo-conversion rate (Green/Blue and Red/blue) is measured by using a CAS 140 CT spectrometer equipment and specifically, by putting a bare glass on the blue BLU covered with a diffusing film to first get a reference measured with a detector and then, putting single films obtained by respectively coating the photosensitive resin compositions according to Example 1 to Example 8, Comparative Example 1, and Comparative Example 2 and measuring a blue-to-green or blue-to-red converted peak increase amount relative to a blue absorption peak decrease amount. In addition, the process maintenance rate is also obtained by measuring how much a photo-conversion rate of the initial soft-baking step was maintained in the hard-baking step, that is, how much the photo-conversion rate is maintained from the soft-baking step to the hard-baking step.

TABLE 2

|  |  | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|---|
| Thickness (μm) |  | 6.0 | 5.9 | 6.0 | 5.8 | 6.1 | 5.9 | 6.1 | 5.8 | 6.0 | 5.9 |
| 450 nm incident light absorption rate (%) |  | 84.0 | 84.1 | 79.0 | 79.0 | 83.8 | 84.1 | 83.8 | 82.9 | 84.5 | 78.0 |
| Photo-conversion rate (%) | soft-baking | 29.4 | 29.6 | 29.7 | 30.5 | 30.1 | 29.9 | 30.1 | 28.7 | 29.7 | 30.3 |
|  | hard-baking | 24.1 | 24.7 | 22.5 | 24.0 | 24.2 | 23.8 | 22.6 | 23.8 | 17.0 | 14.6 |
| Maintenance rate (%) |  | 82.0 | 83.4 | 75.8 | 79.0 | 80.4 | 79.6 | 75.1 | 82.9 | 57.0 | 48.0 |

As shown in Table 2, the photosensitive resin compositions according to Example 1 to Example 8 exhibited an improved photo-conversion rate and process maintenance rate compared with Comparative Example 1 and Comparative Example 2.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A photosensitive resin composition, comprising
(A) a quantum dot;
(B) a binder resin including a structural unit represented by Chemical Formula 1;
(C) a photopolymerizable monomer;
(D) a photopolymerization initiator; and
(E) a solvent:

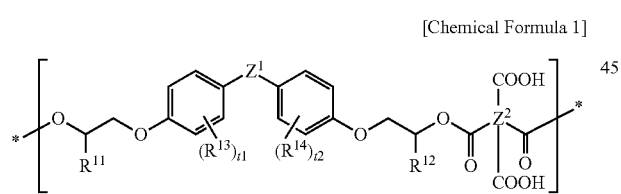

[Chemical Formula 1]

wherein, in Chemical Formula 1,
$R^{11}$ and $R^{12}$ are independently represented by Chemical Formula 2,

*-$L^1$-$L^2$-$R^1$  [Chemical Formula 2]

wherein, in Chemical Formula 2,
$L^1$ is a substituted or unsubstituted C1 to C10 alkylene group,
$L^2$ is an oxygen atom or a sulfur atom,
$R^1$ is "a C1 to C10 alkyl group substituted with a C1 to C10 alkylthio group" or "a C6 to C20 aryl group substituted with a C1 to C10 alkylthio group",
$R^{13}$ and $R^{14}$ are independently a hydrogen atom, a halogen atom, or a substituted or unsubstituted C1 to C20 alkyl group, and
$Z^1$ is a single bond, O, CO, $SO_2$, $CR^{17}R^{18}$, $SiR^{19}R^{20}$, or one of linking groups represented by Chemical Formula 1-1 to Chemical Formula 1-11, wherein, $R^{17}$ to $R^{20}$ are independently a hydrogen atom or a substituted or unsubstituted C1 to C20 alkyl group,

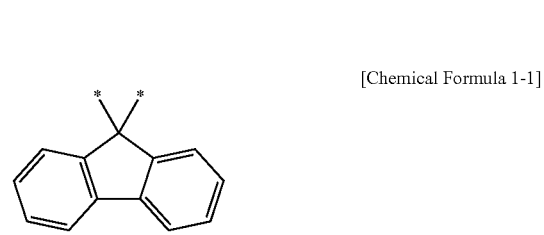

[Chemical Formula 1-1]

[Chemical Formula 1-2]

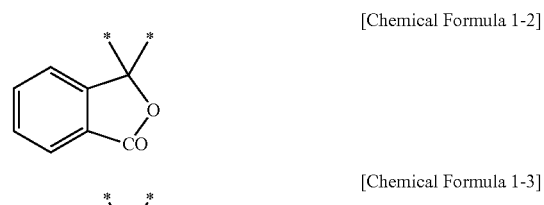

[Chemical Formula 1-3]

[Chemical Formula 1-4]

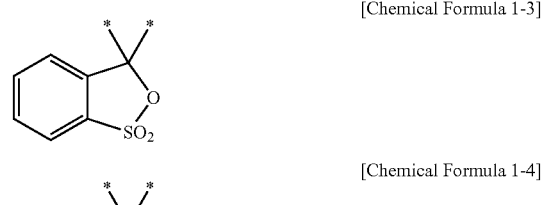

[Chemical Formula 1-5]

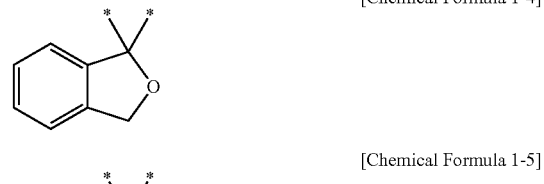

wherein, in Chemical Formula 1-5,
$R^a$ is a hydrogen atom, an ethyl group, $C_2H_4Cl$, $C_2H_4OH$, $CH_2CH=CH_2$, or a phenyl group,

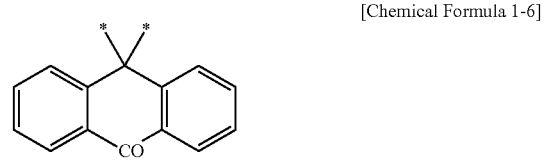

[Chemical Formula 1-6]

-continued

[Chemical Formula 1-7]
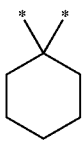

[Chemical Formula 1-8]

[Chemical Formula 1-9]

[Chemical Formula 1-10]
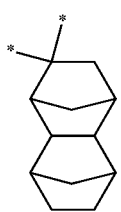

[Chemical Formula 1-11]
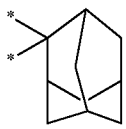

$Z^2$ is an acid anhydride residual group, and
t1 and t2 are independently an integer ranging from 0 to 4.

2. The photosensitive resin composition of claim 1, wherein the $R^1$ is "a C1 to C5 alkyl group substituted with a C1 to C5 alkylthio group" or "a C6 to C10 aryl group substituted with a C1 to C5 alkylthio group".

3. The photosensitive resin composition of claim 1, wherein the $Z^2$ is represented by one selected from Chemical Formula 3 to Chemical Formula 5:

[Chemical Formula 3]
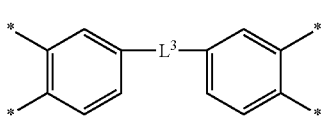

[Chemical Formula 4]
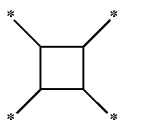

[Chemical Formula 5]
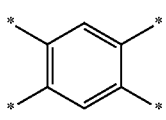

wherein, in Chemical Formula 3,
$L^3$ is a single bond, an oxygen atom, a sulfur atom, *—C(=O)—*, or *—$CR^2R^3$—*, wherein $R^2$ and $R^3$ are independently a halogen atom-substituted or unsubstituted C1 to C10 alkyl group.

4. The photosensitive resin composition of claim 1, wherein the binder resin has a weight average molecular weight of 2,000 g/mol to 20,000 g/mol.

5. The photosensitive resin composition of claim 1, wherein the photosensitive resin composition further includes an acryl-based binder resin.

6. The photosensitive resin composition of claim 1, wherein the photosensitive resin composition further includes 0.5 wt % to 10 wt % of (F) a scatterer based in a total amount of the photosensitive resin composition.

7. The photosensitive resin composition of claim 6, wherein the scatterer includes barium sulfate, calcium carbonate, titanium dioxide, zirconia, or a combination thereof.

8. The photosensitive resin composition of claim 1, wherein the photosensitive resin composition further includes a thiol-based additive.

9. The photosensitive resin composition of claim 8, wherein the thiol-based additive includes at least two functional groups represented by Chemical Formula 7 at the terminal end:

[Chemical Formula 7]
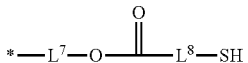

wherein, in Chemical Formula 7,
$L^7$ and $L^8$ are independently a single bond, a substituted or unsubstituted C1 to C20 alkylene group, a substituted or unsubstituted C3 to C20 cycloalkylene group, a substituted or unsubstituted C6 to C20 arylene group, or a substituted or unsubstituted C2 to C20 heteroarylene group.

10. The photosensitive resin composition of claim 1, wherein the quantum dot absorbs light of 360 nm to 780 nm and emits fluorescence of 500 nm to 700 nm.

11. The photosensitive resin composition of claim 1, wherein the photosensitive resin composition includes:
1 wt % to 30 wt % of (A) the quantum dot;
1 wt % to 30 wt % of (B) the binder resin;
1 wt % to 10 wt % of (C) the photopolymerizable monomer;
0.1 wt % to 5 wt % of (D) the photopolymerization initiator; and
a balance amount of (E) the solvent
based in a total amount of the photosensitive resin composition.

12. The photosensitive resin composition of claim 1, wherein the photosensitive resin composition further includes malonic acid; 3-amino-1,2-propanediol; a silane-based coupling agent; a leveling agent; a fluorine-based surfactant; or a combination thereof.

13. A photosensitive resin layer manufactured using the photosensitive resin composition of claim 1.

14. A color filter comprising the photosensitive resin layer of claim 13.

* * * * *